US009030792B2

(12) United States Patent
Krajci

(10) Patent No.: US 9,030,792 B2
(45) Date of Patent: May 12, 2015

(54) OVERVOLTAGE PROTECTION METHOD USING EXPOSED DEVICE SUPPLY RAIL

(75) Inventor: Martin Krajci, Palatine, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 13/451,655

(22) Filed: Apr. 20, 2012

(65) Prior Publication Data
US 2013/0279054 A1 Oct. 24, 2013

(51) Int. Cl.
 H02H 3/20 (2006.01)
 H02H 9/04 (2006.01)
 H02H 3/22 (2006.01)

(52) U.S. Cl.
 CPC .............. *H02H 3/20* (2013.01); *H02H 9/046* (2013.01); *H02H 3/22* (2013.01)

(58) Field of Classification Search
 CPC ............ H02H 3/20; H02H 9/046; H02H 3/22
 USPC .................................................. 361/86, 91.1
 See application file for complete search history.

(56) References Cited

U.S. PATENT DOCUMENTS

| 4,032,967 | A | * | 6/1977 | Harwood | 348/641 |
| 4,661,879 | A | * | 4/1987 | Sato et al. | 361/58 |
| 5,757,713 | A | * | 5/1998 | Gans et al. | 365/226 |
| 6,137,351 | A | * | 10/2000 | Alderman et al. | 327/563 |
| 6,301,133 | B1 | * | 10/2001 | Cuadra et al. | 363/65 |
| 6,888,108 | B2 | * | 5/2005 | Carr | 219/483 |
| 7,319,358 | B2 | * | 1/2008 | Senthinathan et al. | 327/538 |
| 7,759,729 | B2 | * | 7/2010 | Bjoerk et al. | 257/330 |
| 7,768,752 | B2 | | 8/2010 | Souma | |
| 7,804,692 | B2 | * | 9/2010 | Lu | 361/763 |
| 2002/0186518 | A1 | | 12/2002 | Nishikawa et al. | |
| 2003/0067727 | A1 | | 4/2003 | Lee | |
| 2009/0034139 | A1 | | 2/2009 | Martin | |
| 2009/0045788 | A1 | | 2/2009 | Williams et al. | |

FOREIGN PATENT DOCUMENTS

| EP | 0708515 A1 | 4/1996 | |
| FR | 2619262 A1 | 2/1989 | |
| JP | 2001231211 | * 8/2001 | D05B 69/12 |
| JP | 2007267537 A | 10/2007 | |
| WO | 2007/142015 A1 | 12/2007 | |
| WO | 2009/126241 A1 | 10/2009 | |

OTHER PUBLICATIONS

Search Report dated Jun. 21, 2012, from corresponding GB Patent Application No. 1208605.4.

* cited by examiner

*Primary Examiner* — Zeev V Kitov

(57) ABSTRACT

A semiconductor device may be protected from over-voltages via a comparator-controlled, high-current FET coupled to the semiconductor device output and between circuit devices that carry high voltages. A three-terminal, N-channel field effect transistor (FET) may have its source coupled to the output of the semiconductor device to be protected from over voltage. The FET drain may be connected to the load to be driven by the semiconductor device. A transistor, or other voltage comparator, may be configured and connected in order to compare the voltage on the FET drain to a $V_{max}$ reference voltage. When a voltage on the FET drain exceeds $V_{max}$, the comparator output may shut down the FET, thereby isolating the semiconductor device, which is connected to the FET source, from the overvoltage on the FET drain.

8 Claims, 2 Drawing Sheets

OVERVOLTAGE PROTECTION METHOD USING EXPOSED DEVICE SUPPLY RAIL

BACKGROUND

Many electronic devices in motor vehicles operate at voltages less than the vehicle's battery voltage. By way of example, an audio amplifier of an entertainment system, might require a nominal power supply voltage of 5 volts. If the amplifier's transistor output is connected to vehicle speakers by wires that are routed along or adjacent to other conductors that can carry the vehicle's battery supply voltage, a possibility exists that the battery supply voltage carried in adjacent wires might be inadvertently connected or "shorted" to the output stage of the audio amplifier. When a semiconductor is exposed to a voltage that exceeds its maximum rated voltage, it is often damaged or destroyed.

Some semiconductor circuits can be protected from overvoltage using a Zener diode connected between the semiconductor device and a reference potential. Others may use a protection circuit that disconnects the device when a Zener voltage of a Zener diode is exceeded. A Zener diode, however, will only conduct when an applied reverse bias voltage is great enough to trigger its breakdown, and this voltage cannot be accurately controlled. A Zener diode is, therefore, unable to protect against possible voltages that are less than its breakdown voltage. Another problem with using a Zener diode to protect a semiconductor from overvoltage is that its response time may be slow. It can also interfere with analog and digital signals as well as radio frequency signals output from a semiconductor. A circuit that is able to protect the output stage of a semiconductor from overvoltages without having the problems of a Zener diode or other methods would be an improvement over the prior art.

BRIEF SUMMARY

A semiconductor device may be protected from over-voltages via a comparator-controlled, high-current FET coupled to the semiconductor device output and between circuit devices that carry high voltages. A three-terminal, N-channel field effect transistor (FET) may have its source coupled to the output of the semiconductor device to be protected from over voltage. The FET drain may be connected to the load to be driven by the semiconductor device. A transistor, or other voltage comparator, may be configured and connected in order to compare the voltage on the FET drain to a $V_{max}$ reference voltage. When a voltage on the FET drain exceeds $V_{max}$, the comparator output may shut down the FET, thereby isolating the semiconductor device, which is connected to the FET source, from the overvoltage on the FET drain.

DETAILED DESCRIPTION

Figure 1:
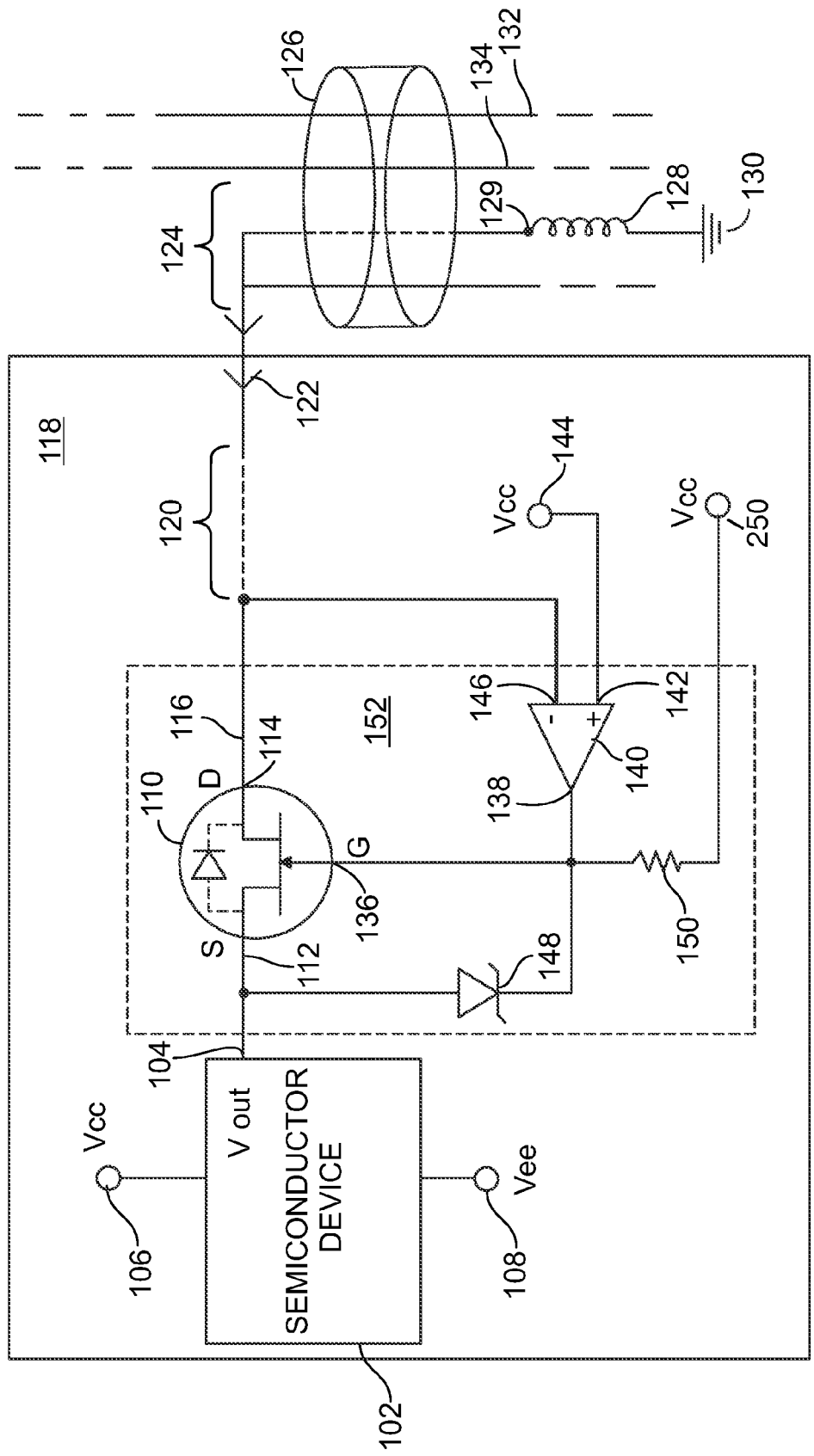
FIG. 1 is a block diagram of an embodiment of a system and circuit for protecting a semiconductor device from overvoltages.

FIG. 1 depicts a block diagram of a system 100 for protecting a semiconductor device 102 from an overvoltage, such as one that is inadvertently or deliberately connected to its output or input terminal 104. The system is comprised of a semiconductor device 102, which may be, for example, an audio amplifier, or any other semiconductor device. In FIG. 1, the semiconductor device 102 is connected between a positive supply voltage $V_{CC}$ 106 and a negative supply voltage $V_{ee}$ or ground 108.

The output or input terminal or port 104 is connected to a three-terminal field effect transistor (FET) 110. The source node or terminal 112 of the transistor 110 is connected to the output or input terminal 104 of the semiconductor device 102. The drain 114 of the transistor 110 is connected to a signal line 116, which is depicted in FIG. 1 as extending over the surface of a circuit board 118 by an extended distance 120. The signal line 116 also extends off the circuit board 118 through an edge connector 122, which provides an electrical and mechanical connection to an extended-length of signal conductor 124.

Those of ordinary skill in the art will recognize that in a three-terminal FET, the substrate or body of the device is essentially connected to the drain, D. A p-n junction or diode thus exists between the source and drain, which is depicted in FIG. 1 as a diode extending between the source and drain, the anode of which is connected to the source. For purposes of overvoltage protection, the source and drain connections should not be reversed because of the p-n junction that exists between the source and drain. If the FET were to be reversed, the diode would be forward biased and conductive whenever an overvoltage is applied to the source.

Since the system 100 is intended for use in a motor vehicle, the signal conductor 124 typically runs alongside, and in physical contact with, multiple other conductors, often times through a cable conduit 126. The signal conductor 124 eventually reaches a load or signal source 128 to which it is connected via a connection node 129.

In FIG. 1, the load or signal source 128 is connected to a ground or reference potential 130. In alternate embodiments, where the load is connected to "bridged" amplifiers, the load is connected between two of the circuits shown in FIG. 1.

The conductor 124 that extends through the conduit 126 travels alongside other conductors 132 and 134, which, when they are in the conduit 126, they are adjacent to, or in close proximity to, the signal-bearing conductor 124. Electrical conductors that are adjacent to, and in close proximity to, the conductors 116 and 124 can include both circuit board traces (conductors) and wires. The close proximity, and even physical contact, of the conductors 124, 132, and 134 in a closely-packed conduit 126 makes the conductor 124 susceptible to being connected to voltages on those adjacent conductors 132 and 134, which, if connected to a battery voltage or higher voltage level supply, makes the conductor 124 susceptible to picking up a voltage that exceeds the $V_{CC}$ voltage 106. In such an event, an overvoltage impressed upon the conductor 124 will be carried back to the output or input terminal 104 of the semiconductor device 102. If the output or input terminal 104 and the semiconductors "behind" it are not protected, they will almost invariably be damaged or destroyed. An intervening voltage clamp is therefore provided that will shut off or block overvoltage and is located as close to the amplifier 102 as is physically possible in order minimize the length of conductor 116 and 124 that might be susceptible to being "shorted" to an overvoltage. The voltage clamp is embodied as an N-channel FET controlled by a voltage comparison device that shuts the FET off when a voltage on the output side or protected side of the device exceeds the power supply voltage applied to the protected semiconductor 102.

Those of ordinary skill in the electronics art know the operation of a conventional voltage comparator. They also know the operating characteristics of both field effect transistors and bipolar junction transistors. In FIG. 1, the field effect transistor 110 has its gate terminal 136 connected to the output 138 of a voltage comparator 140. The FET, and its channel resistance, is thus controlled by the comparator. The FET can thus be "shut off" or "turned on" by the voltage applied to the gate terminal.

The non-inverting input 142 of the comparator 140 is connected to a voltage potential $V_{CC}$, which is the highest voltage potential permitted on the output or input of the semiconductor device. The inverting input 146 of the comparator 140 is connected to the output conductor 116, which is on the circuit board 118. If the voltage on the inverting input 146 exceeds the $V_{cc}$ value, the output 138 of the comparator 140 will go "low" driving the gate input 136 low and, therefore, shutting the transistor 110 off, by which is meant that it drives the FET's channel to a high resistance value. In operation, voltages on the exposed side or "drain side" of the FET, are thus shut off, or isolated from, the protected side, which is the "source side" 112 of the FET.

If the voltage on the conductor 116 remains below the $V_{max}$ value, the output voltage from the comparator 140 remains high driving the gate voltage high to a voltage potential of $V_{max}$, which is the highest voltage potential present in the vehicle, which drives the transistor to a saturation state, or low resistance state, allowing the output 104 of the semiconductor device 102 to be directly connected to the load 128 via the intervening conductors. As long as the output voltage, or the voltage on the conductor 116, remains below $V_{cc}$, the FET transistor 110 maintains an impedance, or resistance, near zero.

The Zener diode 148 connected across the source and gate terminals of the transistor 110 prevents exceeding maximum allowed gate-source voltage of the FET transistor.

The resistor 150 connected between the $V_{max}$ and the output 138 of the comparator 140 enables the comparator 140 to pull the gate voltage high when no overvoltage is present on the signal line 116.

As stated above, the overvoltage protection provided by the overvoltage protection circuit 152 enclosed in the broken lines is optimized by placing the overvoltage protection circuit 152 as close as possible to the physical output terminal 104 of the semiconductor device 102. In FIG. 1, the overvoltage protection circuit is located on a circuit board 118 to minimize the exposed conductor between the output terminal 104 and the overvoltage protection circuit 152.

Figure 2:
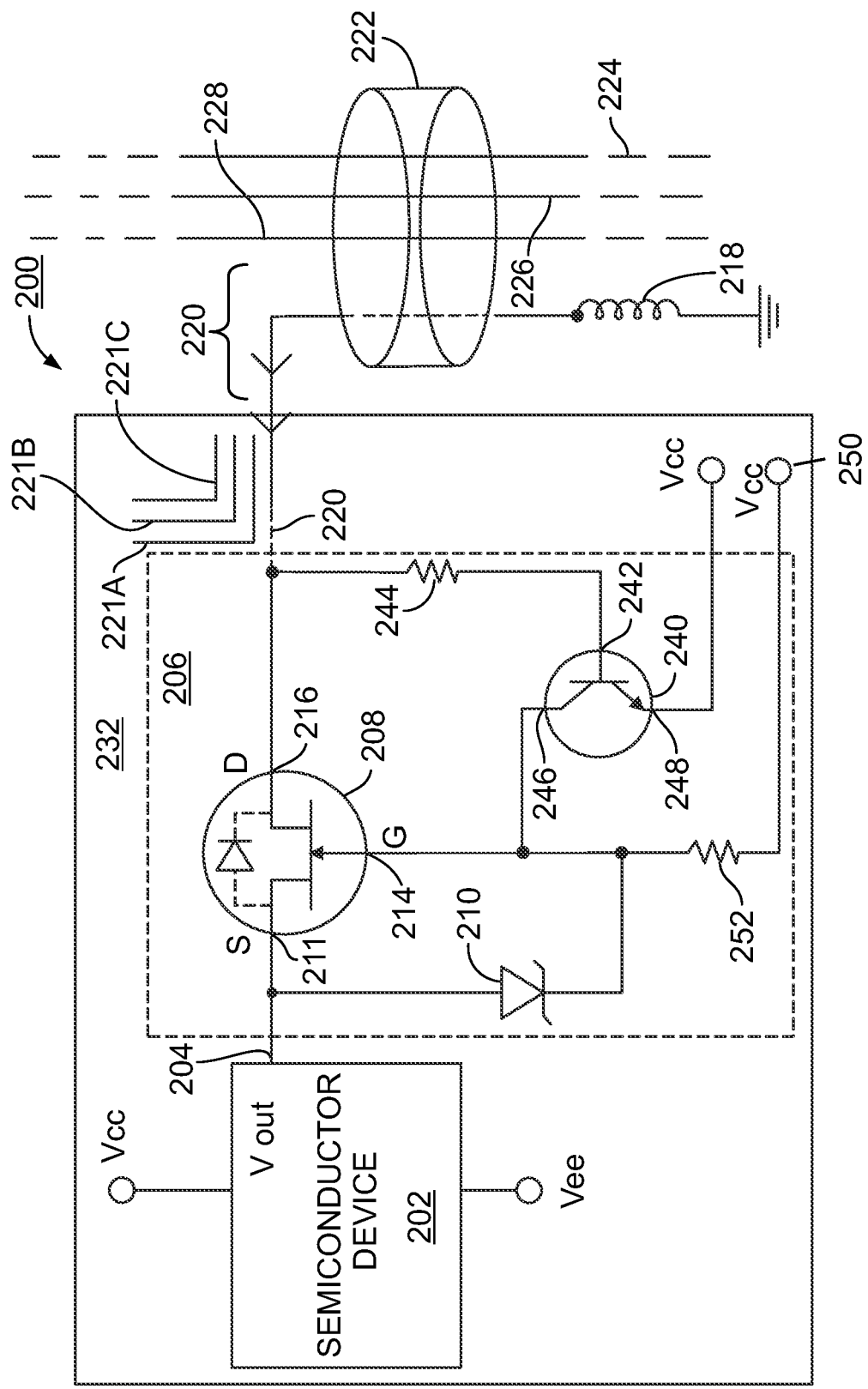
FIG. 2 is a depiction of an embodiment of a system and circuit for protecting semiconductor devices from overvoltages.

FIG. 2 is a block diagram of an embodiment of an overvoltage protection system and circuit. In FIG. 2, a semiconductor device, which may be, for example, an integrated circuit audio amplifier, 202 has an output terminal 204 electrically connected to an overvoltage protection circuit 206 comprised of an N-channel FET 208 and a voltage-comparing NPN transistor. The source terminal 211 of the FET 208 is connected to the output terminal 204 of the semiconductor device 202 to be protected. A Zener diode 210 is connected across the source 211 and the gate 214 as shown.

The drain 216 of the FET 208 is connected to a load 218 via an extended lead wire 220 that is, or can be, routed alongside, and in close proximity to, other conductors 221A-221C on the surface of, or embedded in, a circuit board 232. The lead wire 220 leaves the circuit board 232 at an edge connector 230 and continues through a conduit 222 through which yet additional high voltage conductors 224, 226, and 228 are also routed.

The NPN transistor 240, which is physically as close as possible to the FET 208, has its base 242 connected to the output or drain terminal 216 through a bias resistor 244. The collector 246 is connected to the gate 214. The emitter 248 is connected to the power supply voltage for the amplifier 202.

A $V_{max}$ reference potential 250, which is the maximum voltage available in the motor vehicle and higher enough than Vcc to keep the FET transistor 208 turned on, is isolated from the gate 214 by a resistor 252.

Those of ordinary skill in the art will recognize that the base-emitter voltage or $V_{BE}$ of an NPN bipolar junction transistor is between about 0.6 and about 0.7 volts when the transistor is biased "on." Those of ordinary skill in the art will also recognize that the collector-emitter voltage, $V_{CE}$ of a saturated NPN transistor is about 0.2 to 0.3 volts.

As the circuit of FIG. 2 is constructed, the NPN transistor 240 will turn "on" and saturate when the voltage at the base 242 is at least 0.6 to about 0.7 volts greater than $V_{CC}$. Stated another way, the transistor will turn on pulling the gate voltage low when the voltage at the drain is greater than $V_{CC}$ by about 0.6 up to about 0.7 volts. When the transistor turns on, the gate voltage on the FET 208 will thus be about 0.2 to 0.3 volts above $V_{CC}$ effectively shutting off the field effect transistor 208. The field effect transistor 211 thus acts as a source follower in that it provides a voltage at the source terminal 211 that essentially is less than the voltage at the gate 214 of the FET 208.

For claim construction purposes, electrical conductors or devices of any kind, which carry voltages that are over, i.e., greater than, the safe maximum operating voltage of the semiconductor device protected by the FET 208, are considered herein to be overvoltage circuit devices. A load or a signal source that is connected to a protected semiconductor is considered to be off of a circuit board and an "off board" load or signal source if the load is not physically located anywhere on a circuit board on which a protected semiconductor is mounted. An "on-board" load or signal source is one that is physically located on the same circuit board as a protected semiconductor.

The foregoing description is for purposes of illustration only. The true scope of the invention is set forth in the appurtenant claims.

The invention claimed is:

1. An overvoltage protection circuit for a vehicle, the circuit comprising:
    a circuit board;
    a semiconductor device attached to the circuit board and coupled to a supply voltage, the semiconductor having an output, which requires protection from signals applied to said output that have a voltage greater than the supply voltage;
    a three-terminal field effect transistor (FET) attached to the circuit board, and configured to provide over-voltage protection to the output of the semiconductor device, the FET having a source, which is coupled to said semiconductor device output, the FET having a drain, the voltage of which is susceptible to being provided a voltage that is greater than the supply voltage and, the FET also having a gate, which is coupled to the supply voltage through a resistor having a first side coupled to the gate and a second side coupled to the supply voltage;
    an electrical load, that is away from the circuit board and which is configured to be driven by the semiconductor device;
    an electrical conductor, extending between and electrically connecting said drain to said electrical load, at least a portion of the electrical conductor extending through at least a portion of a conduit in the vehicle, said portion of the conduit in the vehicle being away from the circuit board and having therein, the electrical conductor and at least one other conductor having an over-voltage, the over-voltage being a voltage having a magnitude that exceeds the magnitude of said supply voltage and which if connected to the output of the semiconductor device would damage said semiconductor device;

a voltage comparator attached to the circuit board, the voltage comparator, having first and second inputs and an output, the first input being electrically coupled to the electrical conductor, the second input being coupled to the supply voltage, the output being coupled to the second side of the resistor and thereby coupled to the gate, the comparator being configured to generate an output voltage that turns the FET on as long as the first input voltage is less than the supply voltage;

whereby an over-voltage on the electrical conductor provided by said at least one of said other conductors causes the voltage comparator output voltage to shut off the FET and thereby prevent an overvoltage on the electrical conductor from reaching the output of the semiconductor.

2. The circuit of claim 1, wherein the circuit board comprises a circuit board trace on a surface of the circuit board and additionally comprises a connector for the electrical conductor that extend at least part way through the conduit, the circuit board trace extending between and electrically connecting the drain of the FET to the connector, the electrical conductor being a lead wire that is attached to the connector and which extends therefrom into the portion of the conduit, the first input of the voltage comparator being physically connected to said circuit board trace.

3. The circuit of claim 1, wherein the load is located off of the circuit board.

4. The circuit of claim 1, wherein the comparator is an operational amplifier.

5. The circuit of claim 1, wherein the comparator comprises a differential pair of transistors.

6. The circuit of claim 1, wherein the comparator is a single transistor, the collector of which is coupled to the gate, the emitter of which is coupled to the supply voltage, and the base of which is coupled to the electrical conductor.

7. The circuit of claim 1, wherein the FET is an N-channel field effect transistor.

8. The circuit of claim 6, wherein the transistor is an NPN transistor.

* * * * *